United States Patent [19]

Nagatsuma et al.

[11] Patent Number: 4,570,064
[45] Date of Patent: Feb. 11, 1986

[54] OPTICAL D.C. ELECTRIC-FIELD MEASURING APPARATUS WITH OPTIC SENSING MEANS EXHIBITING BOTH ELECTROOPTIC AND PHOTOELECTRIC EFFECTS

[75] Inventors: Kazuyuki Nagatsuma, Hachioji; Hiroyoshi Matsumura, Saitama; Toshio Katsuyama, Hachioji; Tsuneo Suganuma, Tokorozawa, all of Japan

[73] Assignees: Hitachi, Ltd.; Hitachi Cable, Ltd., both of Tokyo, Japan

[21] Appl. No.: 513,314

[22] Filed: Jul. 13, 1983

[30] Foreign Application Priority Data

Jul. 21, 1982 [JP] Japan .................. 57-125786

[51] Int. Cl.[4] .............................. G01D 5/34
[52] U.S. Cl. .................. 250/231 R; 250/227
[58] Field of Search .............. 324/96, 117 R, 244; 250/227, 231 R, 225; 350/96.14, 96.15, 355, 356

[56] References Cited

U.S. PATENT DOCUMENTS 3,708,747 1/1973 Lesueur .................. 324/96
4,412,173 10/1983 Massey .................. 324/96

Primary Examiner—David C. Nelms
Attorney, Agent, or Firm—Antonelli, Terry & Wands

[57] ABSTRACT

An electric-field measuring apparatus utilizing electrooptic effect for measuring the intensity of an electric DC field includes a material exhibiting both electrooptic effect and photoelectric effect or both a material exhibiting the electrooptic effect and a material exhibiting the photoelectric effect which material or materials are irradiated with a continuous light ray of a wavelength capable of inducing the electrooptic effect and an intermittently interrupted light ray of a wavelength capable of inducing the photoelectric effect.

16 Claims, 7 Drawing Figures

OPTICAL D.C. ELECTRIC-FIELD MEASURING APPARATUS WITH OPTIC SENSING MEANS EXHIBITING BOTH ELECTROOPTIC AND PHOTOELECTRIC EFFECTS

The present invention relates generally to an electric-field measuring apparatus in which use is made of an electrooptic effect. More particularly, the present invention concerns an optical electric-field measuring apparatus intended primarily for the measurement of an electric DC field.

In most of hitherto known voltage measuring apparatus and electric-field measuring apparatus in which materials exhibiting electrooptic effects (hereinafter referred to as electrooptical crystal) are used, the objects to be measured by these apparatus are restricted to AC voltages and electric AC fields. The reason may be explained by the fact that the electrooptical crystal placed stationarily in an electric DC field usually exhibits an electrostatic capacity and a DC resistance of great values, involving variation in the value of the measurement as a function of time, and that electric charge concentration takes place on the crystal surface to form a so-called skin surface which renders the measurement impossible.

In the known electric-field measuring apparatus using the electrooptical crystal mentioned above (hereinafter referred to as the optical electric-field measuring apparatus), the electrooptical crystal is stationarily positioned in an electric AC field, wherein birefringence changes induced in the crystal in dependence on changes in the electric field intensity are detected in the form of AC signals indicative of light intensity with the aid of a polarizer, an analyzer or the like to accomplish the measurement of the changes in the electric AC field. A typical example of this type optical electric-field intensity measuring apparatus is described in detail in Japanese Patent application Laid-Open No. 100364/1981.

The following references are cited to show the state of the art:

(i) Japanese Patent application Laid-Open No. 128770/1979

(ii) Japanese Patent application Laid-Open No. 67764/1981

(iii) Japanese Patent application Laid-Open No. 100364/1981

It is an object of the present invention to eliminate the disadvantages of the hitherto known optical electric-field intensity measuring apparatus and provide a novel optical electric-field intensity measuring apparatus which is capable of measuring the intensity of an electric DC field as well.

In view of the above object, there is provided according to an aspect of the invention an optical electric-field measuring apparatus which comprises a light source part, a field sensing part for varying the intensity of light emitted by the light source correspondingly in dependence on the intensity of an electric field, a measuring part for measuring the intensity of light delivered from the field sensing part and light guide means for optically coupling the field sensing part to the light source, and the measuring part, respectively, wherein the field sensing part includes a medium or material which exhibits both electrooptic effect and photoelectric effect or alternatively includes both of a material exhibiting the electrooptic effect and a material exhibiting the photoelectric effect, while the light source is adapted to produce at least light of the wavelength capable of inducing the electrooptic effect and light of the wavelength capable of inducing the photoelectric effect.

In a preferred embodiment of the invention, light for giving rise to the photoelectric effect may be in the form of an intermittent light beam, typically a pulse light beam.

The above and other objects, features and advantages of the present invention will be more apparent when reading the following description of the preferred embodiments thereof taken in conjunction with the accompanying drawings; in which.

Figure 1:
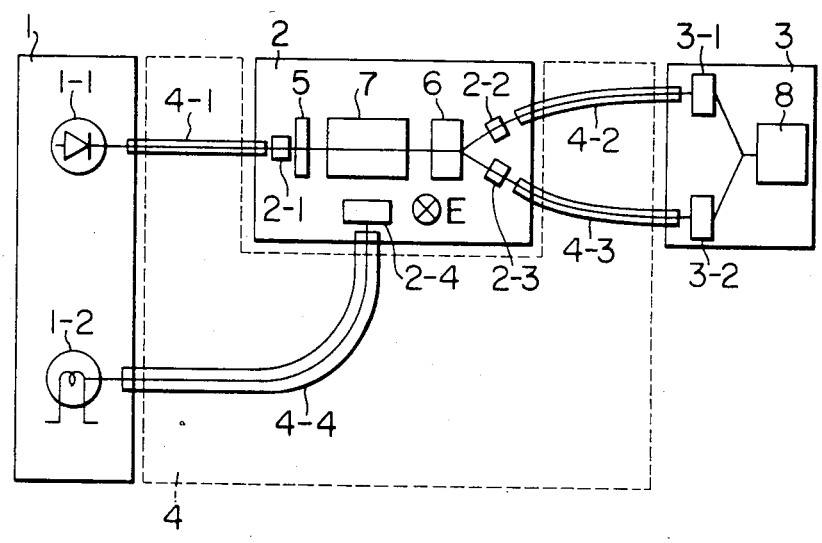
FIG. 1 is a schematic view illustrating a structure of the optical electric-field measuring apparatus according to an embodiment of the invention.

In the optical electric-field measuring apparatus realized according to the teachings of the present invention, a medium or material exhibiting a photoelectric effect (hereinafter referred to as the photoelectric material) is intermittently irradiated with light so as to cause the conductivity of the photoelectric material to vary correspondingly. As the result, the electric charge due to the electric charge concentration in the surface layer of the electrooptical crystal can be intermittently discharged by way of the photoelectric material whose conductivity is temporarily or intermittently increased as mentioned above. Thus, the electric charge which has provided the main cause for the impossibility of measurement of an electric DC field in the hitherto known electric-field measuring apparatus can be intermittently neutralized. In other words, the optical electric-field measuring apparatus is imparted with the capability of measuring electric DC fields.

For neutralizing intermittently the electric charge as mentioned above, the photoelectric material is inserted between two surfaces of the electrooptical crystal on which the electric charges are present and so arranged that the photoelectric material is intermittently irradiated with light from a light source. On the other hand, in the apparatus in which the electrooptical crystal as used exhibits not only the electrooptic effect but also the photoelectric effect, the structure of the electrooptical crystal is by itself equivalent to the structure in which a part exhibiting the photoelectric effect is interposed between the surfaces on which the electric charges are present. Accordingly, there arises no necessity to provide additionally any photoelectric material.

In case the electrooptical crystal and the photoelectric material are separately provided, both of them may be combined in the manner mentioned below.

The photoelectric material is bonded by means of an adhesive or the like to one or each of both surface of the electrooptical crystal extending in parallel with the direction in which the electric field is applied, while the end faces of the electrooptical crystal and the photoconductive material extending perpendicularly to the direction in which the electric field is applied are electrically connected to each other or alternatively the photoelectric material mentioned above may be replaced by a photoelectric element which is electrically connected between the end faces of the electrooptical crystal extending perpendicularly to the direction in which the electric field is applied.

In either case of the structures described above, the part which exhibits the photoelectric effect has to be irradiated intermittently with light of the wavelength which induces the photoelectric effect as desired.

As the material capable of exhibiting both the electrooptic effect and the photoelectric effect, there may be mentioned a single crystal of CdS. This is however only by way of example, and the invention is never restricted to the use of this specific material. In the case of the single crystal of CdS, the wavelengths of light capable of bringing about the electrooptic effect and the photoelectric effect are about 0.8 $\mu$m and about 0.4 $\mu$m, respectively.

The light on the photoconductive material is alternately turned on or off for cyclic irradiation on the same. In this cyclic operation, no restriction is inherently imposed on the upper limit of the duration time or on-time for irradiation with light. However, since the output signal due to the electrooptic effect disappears during irradiation with light, the upper limit of the irradiation or exposure time should preferably be predetermined in consideration of convenience for the measurement. On the other hand, an excessively short irradiation time will be accompanied with such difficulty that the electric charge can not be sufficiently discharged. Thus, there is a lower limit imposed on the irradiation time which can however be determined through simple experiments. Further, the upper limit of the off-time during which the photoelectric material is not irradiated with light corresponds to the time interval during which the electric charges are accumulated to an extent that the measurement of the electric field is impossible due to the accumulated electric charges. This upper limit can easily be determined experimentally, as occasions require. No lower limit is imposed on the time duration in which the photoelectric material is prevented from being irradiated with light. However, when this time duration is excessively short, inconvenience will be incurred in the measurement of the electric field intensity. Accordingly, the non-irradiation time should preferably be set in a range selected so that no inconvenience is involved in the measurement.

The light guide mentioned hereinbefore should preferably be constituted by optical fibers in the manner known per se.

The light source means mentioned hereinbefore may include a light source capable of emitting a wavelength for inducing the electrooptic effect and incapable of emitting the wavelength for inducing the photoelectric effect and another light source having the wavelength capable of inducing the photoelectric effect. Alternatively, the light source means may be constituted by a single light source having both of the above mentioned wavelengths, wherein the wavelength contributing to the photoelectric effect is selected by a filter to effect the intermittent irradiation.

The electric field sensing part or means mentioned hereinbefore may be composed of a lens, a polarizer, the electrooptical crystal, an analyzer and a lens disposed in this order between an optical fiber for the electroopticeffect inducing light source and an optical fiber for the measuring part. Further, a quarter wave retardation plate may be interposed between the electrooptical crystal and the analyzer, if necessary. For the analyzer, any conventional analyzer may be employed. Further, a polarization prism such as a Wollaston prism, for example, may be employed as the analyzer. In the case of the conventional analyzer, the single exit or outlet lens will be sufficient. On the other hand, in case the polarization prism functions to separate the incident ray into two linearly polarized light rays, there are required two exit lenses. The light derived from the field sensing part is guided through the optical fiber to a light receiver of the measuring part or means to be converted into an output electric signal. This output electric signal may be straightforwardly utilized for the measurement. Alternatively, both a light beam branched on the way between the light source means and the electrooptical crystal (i.e. that part of light which is not transmitted through the electrooptical crystal) and light derived from the field sensing means may be received by the light receiver to be converted into respective electric signals on the basis of which the electric field intensity can be arithmetically determined by calculating means. In case the polarization prism is employed as the analyzer, two linearly polarized light rays are separately obtained as the output light rays. Accordingly, these two polarized light rays are converted through the light receiver into corresponding electric signals, which are supplied to the calculating means for arithmetically determining the electric field intensity. It is also possible to omit one or both of the lenses disposed at the input or incident and output (exit) sides, respectively, for expanding the light beam diameter thereby facilitating alignment of the optical axis.

Usually, an optical fiber may be inserted between the photoelectric-effect inducing light source and the portion of the electric field sensing part which exhibits the photoelectric effect. A lens may be disposed in combination with the part exhibiting the photoelectric effect, as the case may be.

In any case, it is essential for the optical electric-field measuring apparatus according to the present invention that a part exhibiting the photoelectric effect be provided in combination with the means for irradiating that part with light of the wavelength capable of inducing the photoelectric effect. With regard to the remaining structure or arrangement, hitherto known techniques may conveniently be adopted.

In the following, the present invention will be described in more detail in conjunction with the embodiments thereof.

FIG. 1 is a view showing a structure of the optical electric-field intensity measuring apparatus according to an embodiment of the present invention. The apparatus comprises light source means 1, electricfield sensing means 2, measuring means 3 and light guide means for coupling them to one another. The light source part or means 1 is composed of a light emitting diode 1-1 for emitting light of wavelength of 0.83 $\mu$m and a mercury lamp 1-2 capable of emitting light of wavelength of the order of 0.44 μm. The electric-field sensing part or means is composed of rod lenses 2-1, 2-2, 2-3 and 2-4, a polarizer 5, a Wollaston prism 6 and an electrooptical crystal 7. The measuring part or means 3 is composed of PIN photodiodes 3-1 and 3-2 and an electric calculating circuit 8. The light guide is composed of single-core optical fibers 4-1, 4-2 and 4-3 each having a core diameter of 500 μm and an optical fiber cable 4-4 constituted by a bundle of the six single-core optical fibers mentioned above. The light emitting diode 1-1 of the light source means 1 emits light of a substantially invariable intensity as a function of time for the measurement of electric field, while the mercury lamp 1-2 emits a pulse-like light ray intermittently broken through corresponding manipulation of an associated power supply circuit for the purpose of neutralizing the electric charge described hereinbefore. The continuous light ray and the pulse-like light ray are separately guided to the electric-field sensing part or means 2 through the optical fiber cables 4-1 and 4-4, respectively. In the electric-field sensing means or part 2, the angle formed between the light vibrating direction (i.e. direction of linearly polarized light) of the polarizer 5 and the optical axis of the Wollaston prism 6 is set at 45°. The light ray for the electric field measurement guided through the optical fiber cable 4-1 is converted to a linearly polarized collimated light ray by means of the rod lens 2-1 and the polarizer, which light ray impinges on the electrooptical crystal 7. Since the elliptic factor of the birefringence ellipsoid of the electrooptical crystal 7 varies in dependence on the intensity of electric field E which is applied in a direction from the front side to the rear side of the figure as viewed in FIG. 1, the incident light ray leaves the electrooptical crystal 7 in the form of elliptically polarized collimated light ray which is then guided to the Wollaston prism 6 to be divided into two right-angled linearly polarized light components and guided, respectively, to the PIN-photodiodes 3-1 and 3-2 through the rod lenses 2-2 and 2-3, the optical fiber cables 4-2 and 4-3 to be converted into electric signals $P_1$ and $P_2$. In the electric calculating circuit 8, an arithmetic operation is formed in accordance with an equation $$S = (P_1 - P_2)/(P_1 + P_2) \quad (1)$$

whereby a voltage of a value corresponding to the intensity of the external electric field is obtained.

On the electric-field sensing part or means 2, the pulse-like light ray for neutralization of the electric charge guided thereto through the optical fiber cable 4-4 irradiates the electrooptical crystal 7 over an area enlarged through the rod lens 2-4.

In the embodiment illustrated, a single crystal of CdS exhibiting both the electrooptic effect (Pockels effect) and the photoelectric effect is used as the electrooptical crystal 7. The direction of light propagation is selected in crystal orientation {100} while the direction in which the electric field is applied is selected in the crystal orientation {001}. The single crystal of CdS is in a rectangular parallelepiped form having sides of length of 6 mm, 5 mm and 5 mm in the directions of crystal axes {100}, {001} and {010}, respectively. The crystal face (100) is finished in a mirror surface, while other surfaces are finished in rough surfaces, respectively. The single crystal of CdS exhibits the resistivity of ca. $10^8 \Omega$-cm under no-irradiation and ca. $10^4 \Omega$-cm under irradiation with light. With the values of these resistivities, the electrooptic effect can be effectively induced under no-irradiation, while a photoelectric current of magnitude sufficient for neutralizing the electric charge can flow through the single crystal due to the photoelectric effect induced upon irradiation with light.

Figure 2A:
FIGS. 2a, 2b and 2c are views for graphically illustrating, respectively, an optical output characteristic of a light emitting diode, an optical output characteristic of a mercury lamp and an electric output of a calculating circuit as a function of time.
Figure 2B:
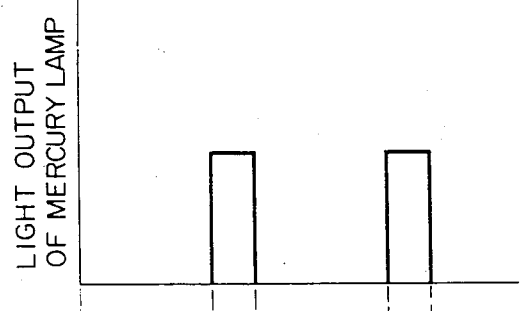
Figure 2C:
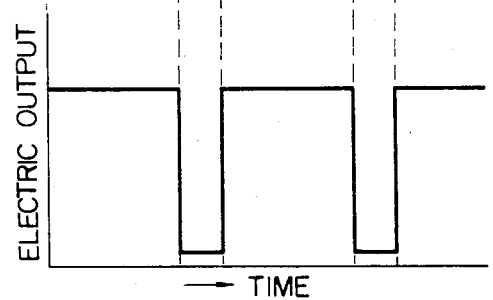

FIGS. 2a to 2c are views for illustrating, respectively, the light output characteristics of the light emitting diode and the mercury lamp and the electric output characteristic of the calculating circuit 8 as a function of time. More specifically, FIG. 2a illustrates the light output characteristic of the light emitting diode, FIG. 2b illustrates the light output characteristic of the mercury lamp and FIG. 2c illustrates the characteristic of the electric output of the calculating circuit represented by the equation (1). When the crystal is irradiated with light of the mercury lamp, the electric output of the calculating circuit is decreased to a negligible degree, and the measurement of the electric field is in the rest state.

In the case of the illustrated embodiment, the intermittent energization period of the mercury lamp is so selected that the irradiation of about 1 minute alternates with the non-irradiation of about 2 minutes. The electric field is a DC field applied with the aid of parallel plate electrodes. In FIG. 1, a symbol E represents the direction of the applied electric DC field.

Figure 3:
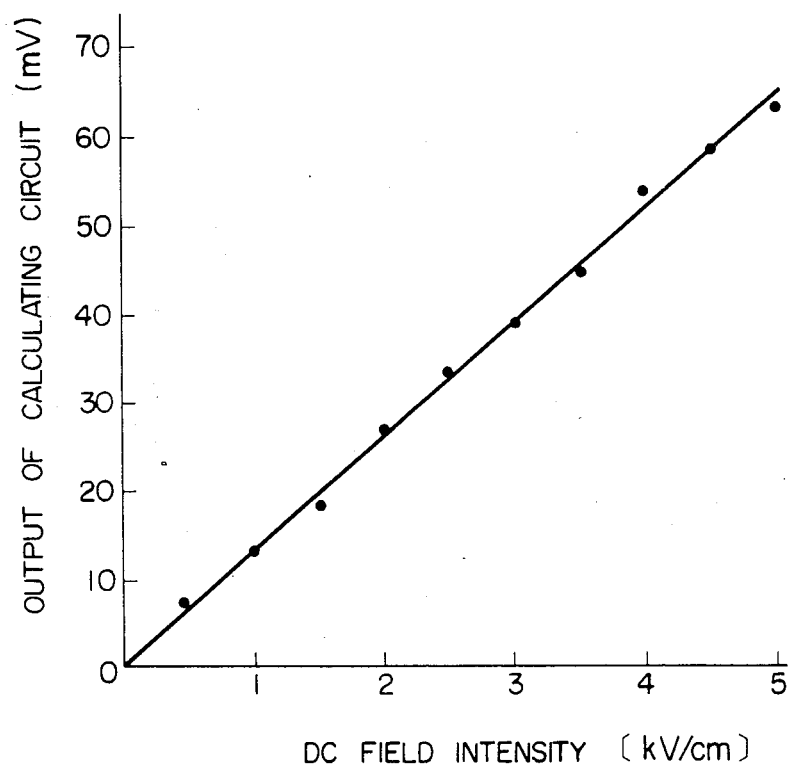
FIG. 3 is a view for graphically illustrating the results of measurement of electric DC field intensities measured with the aid of the optical electric-field measuring apparatus according to an embodiment of the invention.

FIG. 3 shows the result of measurement of the electric field intensity performed actually. It will be seen that the electric DC field intensity and the electric output of the calculating circuit is in a good linear relationship. It is thus obvious that the electric DC field can be measured by the optical electric-field measuring apparatus according to the present invention.

Figure 4:
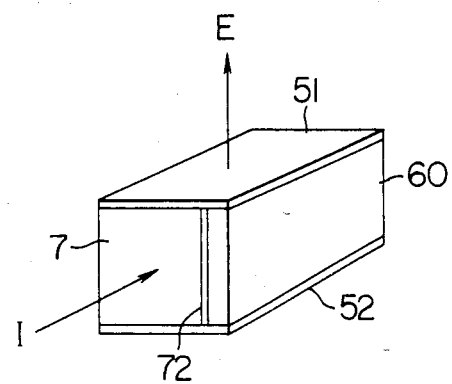
FIG. 4 shows in a perspective view a photoelectric crystal of a composite structure realized according to another embodiment of the invention.
Figure 5:
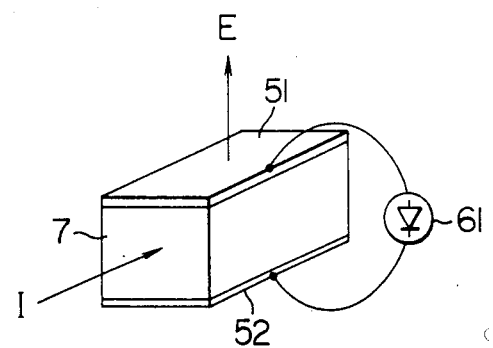
FIG. 5 is a view for illustrating a combination of an electrooptical crystal element and a photoelectric element used in the optical electric-field measuring apparatus according to a still further embodiment of the invention.

In the case of the embodiment described so far, the single crystal of CdS exhibiting both the electrooptic effect and the photoelectric effect is employed as the electrooptical crystal. However, it is possible to the similar effect to use an electrooptical material or medium of a composite structure in which a material exhibiting the photoelectric effect such as CdS, CdSe, PbS or the like is bonded by an adhesive to a single crystal exhibiting the electrooptic effect such as LiNbO$_3$, Bi$_{12}$SiO$_{20}$ or the like destined for measuring the electric field as is in the case of an embodiment shown in FIG. 4. Further, a photoelectric element may obviously be employed to obtain the desired effect, as is shown in FIG. 5. In FIGS. 4 and 5, reference numerals 51 and 52 denote electrodes, 60 denotes the photoelectric material, 61 denotes the photoelectric element, 72 denotes the adhesive, E represents the direction in which the electric field is applied, and I represents the travelling direction of light.

According to the present invention, measurement of an electric DC field which has heretofore been impossible is made possible, to an extremely advantageous contribution to the art.

Obviously many modifications and variations of the present invention are possible in the light of the above teachings. It is therefore to be understood that within the scope of the appended claims the invention may be practiced otherwise than as specifically described.

We claim:

1. An optical electric-field measuring apparatus, comprising: light source means; field sensing means for varying an intensity of light emitted by said light source means correspondingly in dependence on an intensity of an electric field; measuring means for measuring the intensity of light delivered from said field sensing means; and light guide means for optically coupling said light source means; said field sensing means and said measuring means to one another; wherein said field sensing means exhibits both an electrooptic effect and a photoelectric effect, while said light source means produces at least light of a wavelength capable of inducing said electrooptic effect and light of a wavelength capable of inducing said photoelectric effect.

2. An optical electric-field measuring apparatus according to claim 1, wherein said light of the wavelength capable of inducing said photoelectric effect is intermittently interrupted light.

3. An optical electric-field measuring apparatus according to claim 2, wherein said field sensing means includes a material exhibiting both the electrooptic effect and the photoelectric effect.

4. An optical electric-field measuring apparatus according to claim 3, wherein said material is composed of a single crystal of CdS.

5. An optical electric-field measuring apparatus according to claim 2, wherein said field sensing means includes both a material exhibiting the electrooptic effect and a material exhibiting the photoelectric effect.

6. An optical electric-field measuring apparatus according to claim 2, wherein said field sensing means includes a material exhibiting the electrooptic effect and a photoelectric element electrically inserted between end faces of said material extending perpendicularly to the direction in which the electric field is applied to said material.

7. An optical electric-field measuring apparatus according to claim 1, wherein said field sensing means includes a material exhibiting both the electrooptic effect and the photoelectric effect.

8. An optical electric-field measuring apparatus according to claim 1, wherein said field sensing means includes a combination of a first material exhibiting the electrooptic effect and a second material exhibiting the photoelectric effect.

9. An optical electric-field measuring apparatus according to claim 1, wherein said field sensing means includes a combination of a material exhibiting the electrooptic effect and a photoelectric element.

10. An optical electric-field measuring apparatus comprising:

light source means;

field sensing means for sensing an electric field and for varying an intensity of light emitted by said light source means in dependence on an intensity of the electric field;

measuring means for measuring the intensity of light delivered from said field sensing means; and light guide means for optically coupling said light source means, said field sensing means and said measuring means to one another;

said field sensing means exhibiting both an electrooptic effect which in the presence of an electric DC field causes an electric charge which prevents proper sensing of the DC electric field and a photoelectric effect for enabling discharge of the charge induced by the DC electric field so as to enable proper sensing of the DC electric field, said light source means producing at least light of a wavelength capable of inducing the electrooptic effect and light of a wavelength capable of inducing the photoelectric effect.

11. An optical electric-field measuring apparatus according to claim 10, wherein said light of the wavelength capable of inducing the photoelectric effect is intermittently interrupted light.

12. An optical electric-field measuring apparatus according to claim 10, wherein said field sensing means includes a material exhibiting both the electrooptic effect and the photoelectric effect.

13. An optical electric-field measuring apparatus according to claim 12, wherein said material is composed of a single crystal of CdS.

14. An optical electric-field measuring apparatus according to claim 10, wherein said field sensing means includes a combination of a first material exhibiting the electrooptic effect and a second material exhibiting the photoelectric effect.

15. An optical electric-field measuring apparatus according to claim 10, wherein said field sensing means includes a combination of a material exhibiting the electrooptic effect and a photoelectric element.

16. An optical electric-field measuring apparatus according to claim 15, wherein said photoelectric element is electrically inserted between end faces of said material extending perpendicularly to the direction in which the DC electric field is applied to said material.

* * * * *